United States Patent
Ho et al.

(10) Patent No.: US 8,102,020 B2
(45) Date of Patent: Jan. 24, 2012

(54) EQUALIZATION IN PROXIMITY COMMUNICATION

(75) Inventors: Ronald Ho, Mountain View, CA (US);
Robert D. Hopkins, Hayward, CA (US);
William S. Coates, Los Gatos, CA (US);
Robert J. Drost, Los Altos, CA (US)

(73) Assignee: Oracle America, Inc., Redwood Shores, CA (US)

( * ) Notice: Subject to any disclaimer, the term of this patent is extended or adjusted under 35 U.S.C. 154(b) by 1402 days.

(21) Appl. No.: 11/437,457

(22) Filed: May 18, 2006

(65) Prior Publication Data

US 2007/0268125 A1 Nov. 22, 2007

(51) Int. Cl.
*H01L 21/02* (2006.01)

(52) U.S. Cl. .. 257/532; 257/531; 257/735; 257/E23.078

(58) Field of Classification Search ............... 257/531, 257/532, 736, E23.078, E23.179
See application file for complete search history.

(56) References Cited

U.S. PATENT DOCUMENTS

| | | | |
|---|---|---|---|
| 6,559,658 B1 * | 5/2003 | Brandt | 324/681 |
| 7,292,050 B1 * | 11/2007 | Chow et al. | 324/681 |
| 7,356,213 B1 * | 4/2008 | Cunningham et al. | 385/14 |
| 7,425,836 B2 * | 9/2008 | Chow et al. | 324/681 |
| 7,659,619 B1 * | 2/2010 | Zingher et al. | 257/735 |
| 7,693,424 B1 * | 4/2010 | Krishnamoorthy et al. | 398/135 |
| 7,817,880 B1 * | 10/2010 | Drost et al. | 385/14 |
| 2005/0285214 A1 * | 12/2005 | Krishnamoorthy et al. | 257/414 |
| 2007/0268047 A1 * | 11/2007 | Hopkins et al. | 327/111 |
| 2007/0268125 A1 * | 11/2007 | Ho et al. | 340/539.1 |
| 2007/0291535 A1 * | 12/2007 | Eberle et al. | 365/174 |
| 2008/0061801 A1 * | 3/2008 | Chow et al. | 324/681 |
| 2008/0136424 A1 * | 6/2008 | Chow et al. | 324/662 |
| 2009/0067851 A1 * | 3/2009 | Krishnamoorthy et al. | 398/164 |
| 2009/0085183 A1 * | 4/2009 | Mitchell et al. | 257/686 |
| 2009/0085233 A1 * | 4/2009 | Krishnamoorthy et al. | 257/797 |
| 2009/0089466 A1 * | 4/2009 | Cunningham et al. | 710/100 |

* cited by examiner

*Primary Examiner* — Jarrett Stark
(74) *Attorney, Agent, or Firm* — Park, Vaughan, Fleming & Dowler LLP

(57) ABSTRACT

A device includes a semiconductor die having a surface, a plurality of proximity connectors proximate to the surface, and a circuit coupled to at least one of the plurality of proximity connectors. The semiconductor die is configured to communicate voltage-mode signals through capacitive coupling using one or more of the plurality of proximity connectors. The circuit also includes a filter with a capacitive-summing junction to equalize the signals.

22 Claims, 9 Drawing Sheets

Communicate Signals Between Semiconductor Dies Using Proximity Connectors
1210

Equalize the Signals Using a Filter That Includes a Capacitive-Summing Junction
1212

FIG. 12

EQUALIZATION IN PROXIMITY COMMUNICATION

GOVERNMENT LICENSE RIGHTS

This invention was made with United States Government support under Contract No. NBCH3039002 awarded by the Defense Advanced Research Projects Administration. The United States Government has certain rights in the invention.

BACKGROUND

1. Field of the Invention

The present invention relates to techniques for communicating signals between semiconductor dies. More specifically, the present invention relates to a method and an apparatus for equalizing signals that are communicated between semiconductor dies using capacitively coupled proximity pads or connectors.

2. Related Art

Researchers have begun to investigate new techniques for communicating between semiconductor chips. One promising technique involves integrating arrays of capacitive transmitters and receivers onto semiconductor chips to facilitate inter-chip communication. If a first chip is situated face-to-face with a second chip so that transmitter pads on the first chip are capacitively coupled with receiver pads on the second chip, it becomes possible to transmit signals directly from the first chip to the second chip, without having to route the signal through intervening signal lines within a printed circuit board.

In many proximity communication systems, transmit circuits in the first chip and receive circuits in the second chip are close to the transmitter pads and the receiver pads, respectively. Thus, the connecting signal lines in the chips are very short, and consequently have low resistance, low capacitance, and negligible inductance. As such, they do not present a significant load to either the transmit circuits or the receive circuits.

In some proximity communication systems, however, at least some of the signal lines between transmit circuits and/or receive circuits and the corresponding transmitter and/or receiver pads(s) may be relatively long. These signal lines may have appreciable resistance, capacitance, and possibly inductance. Hence, such signal lines may load down the transmit circuits and/or receive circuits, and may consequently introduce delays and signal loss in the proximity communication system. Such lossy interconnects may introduce a dominant pole in the proximity communication system's frequency response. This may cause signals at frequencies higher than this pole to be attenuated, thereby leading to degraded edge rates and lower data rates.

What is needed is a method and an apparatus to facilitate capacitive inter-chip communication without the problems listed above.

SUMMARY

In one embodiment of the present invention, a device includes a semiconductor die having a surface, a plurality of proximity connectors proximate to the surface, and a circuit coupled to at least one of the plurality of proximity connectors. The semiconductor die is configured to communicate voltage-mode signals through capacitive coupling using one or more of the plurality of proximity connectors. The circuit also includes a filter with a capacitive-summing junction to equalize the signals.

In some embodiments, the circuit includes a transmit circuit and/or a receive circuit.

In some embodiments, one or more of the plurality of proximity connectors may be included in the capacitive-summing junction.

In some embodiments, the filter may include a finite impulse response (FIR) filter and/or an infinite impulse response (IIR) filter. Moreover, the filter may be configured to provide pre-emphasis to the signals, and/or the filter may be configured to reduce cross-talk between signal paths that include at least two proximity connectors.

In some embodiments, an output voltage from the filter may be a weighted-average of voltages from taps in the filter, wherein a respective weight may correspond to a respective capacitance of a respective tap in the filter. Note that the respective capacitance may correspond to a number of proximity connectors in the plurality of proximity connectors that are selectively coupled to the respective tap, and the respective tap may include a sign-adjustment element.

In some embodiments, the filter may include delay elements that have discrete time delays and/or continuous time delays. If discrete time delays are used, these delay elements may be configured to be clocked using a clock signal that has a frequency that is the same as or different from a chip rate of the circuit. Moreover, the filter may include weight elements that have fixed and/or adjustable weights.

In some embodiments, proximity connectors corresponding to one or more taps in the filter that have time delays relative to a first tap in the filter are in a region, and proximity connectors corresponding to the first tap are positioned around a border of the region. In some embodiments, proximity connectors corresponding to one or more taps in the filter that have time delays relative to a first tap in the filter have respective areas that are less than an area of proximity connectors that correspond to the first tap.

In some embodiments, the device further includes control logic, which is be configured to adjust a frequency response of the filter in accordance with a performance metric of a communication channel that includes the device and another device. This performance metric may include a difference between a sequence received by the other device and a pre-determined sequence. Moreover, the control logic may be configured to adjust the frequency response when the device is powered on, after at least a pre-determined time interval since a last modification or adjustment, and/or continuously.

In some embodiments, the device may be included in a computer system.

Another embodiment provides a method for communicating signals between semiconductor dies using proximity connectors that are capacitively coupled, wherein the signals are communicated using voltage-mode signaling. As the signals are communicated, the signals are equalized using a filter that includes a capacitive-summing junction.

BRIEF DESCRIPTION OF THE FIGURES

FIG. 12 is a flow chart illustrating an embodiment of a process for communicating signals.

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a method, a device, and a system are described. This device communicates with other devices in the system using proximity communication, wherein a circuit in the device is coupled to a plurality of proximity pads or connectors and communicates signals using voltage-mode signaling. This circuit may include an equalizer that has a filter, which may include a capacitive-summing junction. Note that one or more of the plurality of proximity connectors may be included in the capacitive-summing junction. Furthermore, an output voltage from the filter may be a weighted-average of voltages from taps in the filter, and a respective weight may correspond to a respective capacitance of a respective tap in the filter.

A frequency response of a communication channel that includes the filter may be approximately uniform over a range of frequencies. Moreover, cross-talk between signal paths that include at least two proximity connectors may be reduced and/or eliminated by the filter. Note that the filter may increase an effective bandwidth of the communication channel and/or improve system performance (for example, by reducing a bit error rate, by reducing power consumption, and/or by reducing a number of proximity connectors used to communicate the data). The device, therefore, may improve communication of data in proximity communication systems.

Figure 1:
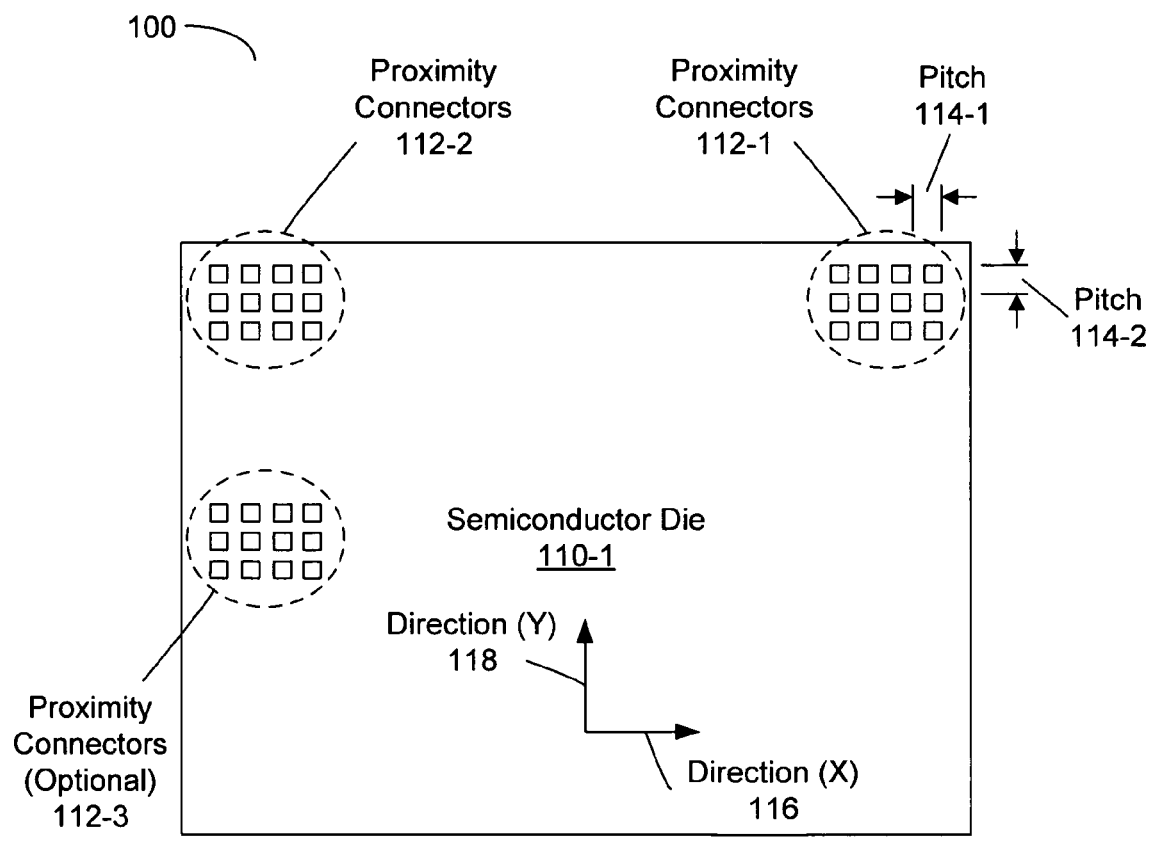
FIG. 1 is a block diagram illustrating an embodiment of a device that includes proximity connectors.

Attention is now directed towards embodiments of a device for improved communication. FIG. 1 is a block diagram illustrating an embodiment of a device 100 that includes proximity connectors or pads 112. Device 100 may include at least one semiconductor die 110, wherein semiconductor die 110 may include integrated circuit electronics corresponding to layers deposited on a semiconductor substrate. Note that one semiconductor die 110 may be packaged in a single-chip module (SCM) and/or a multi-chip module (MCM), wherein the MCM may include two or more SCMs. When packaged, for example in the SCM or the MCM, the one semiconductor die 110 is sometimes referred to as a "chip."

In one embodiment, the proximity connectors 112 may be on or proximate to at least one surface of the semiconductor die 110, the SCM and/or the MCM. In other embodiments, the semiconductor die 110, the SCM and/or the MCM may be coupled to the proximity connectors 112. In exemplary embodiments, the plurality of proximity connectors 112 are substantially located at or near one or more corners (proximity connectors 112-1 and 112-2) and/or edges (proximity connectors 112-3) of the semiconductor die 110. In other embodiments, proximity connectors 112 may be situated at one or more arbitrary locations on, or proximate to, the surface of the semiconductor die 110.

As illustrated for the proximity connectors 112-1, there is a first pitch 114-1 between adjacent connectors or pads in a first direction (X) 116 of the surface and a second pitch 114-2 between adjacent connectors or pads in a second direction (Y) 118 of the surface. In some embodiments, the first pitch 114-1 and the second pitch 114-2 are approximately equal.

Figure 2:
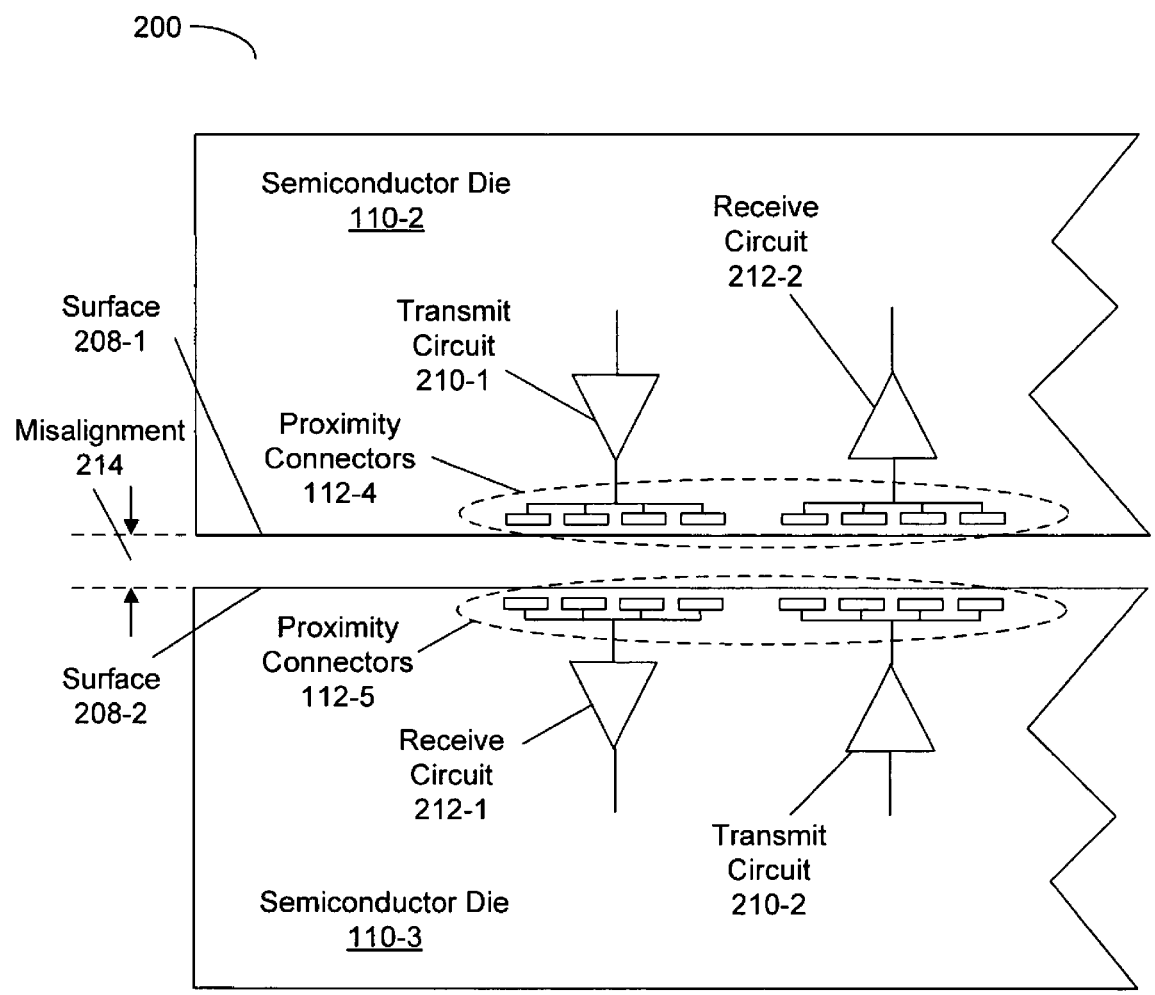
FIG. 2 is a block diagram illustrating an embodiment of a system that includes devices that communicate using proximity communication.

FIG. 2 is a block diagram illustrating an embodiment of a system 200 that includes devices 110 that communicate using proximity communication. The device 110 may include proximity connectors or pads 112 that are on or proximate to at least respective surfaces 208 of the semiconductor dies 110. For example, the plurality of proximity connectors 112 may be situated beneath protective layers such that they are located below the surfaces 208. Moreover, subsets of the proximity connectors 112 may be coupled to transmit circuits 210 (such as transmit drivers) and receive circuits 212 (such as receivers). A respective transmit circuit, at least a subset of the proximity connectors 112 on the adjacent semiconductor dies 110, and a respective receive circuit may constitute a communication channel. For example, the communication channel may include transmit circuit 210-1, some of the proximity connectors 112, and receive circuit 212-1. Note that transmit circuits 210 and receive circuits 212 may utilize voltage-mode signaling (i.e., voltage-mode drivers and receivers). Furthermore, semiconductor dies 110 may also include wiring and electronics (not shown) to relay the data signals to additional electronics on the semiconductor dies 110, such as logic and/or a cache.

In order to communicate data signals using proximity communication, transmit and receive proximity connectors 112 on adjacent semiconductor dies 110 may have, at worst, only limited misalignment, i.e., substantially accurate alignment. For densely packed proximity connectors, i.e., proximity connectors 112 having a small spacing or pitch 114 (FIG. 1) between adjacent pads, the alignment between two or more proximity connectors 112 on adjacent semiconductor dies 110 may be within a few microns in the first direction (X) 116 (FIG. 1) and/or a few microns in the second direction (Y) 118 (FIG. 1) in a first plane including at least some of the proximity connectors 112, and/or within a few microns in a third direction (Z) approximately perpendicular to the first plane. The system 200 illustrates a misalignment 214 in the third direction (Z).

In some embodiments, the proximity connectors 112 may be aligned in six degrees of freedom, including the first direction (X) 116 (FIG. 1), the second direction (Y) 118 (FIG. 1), the third direction (Z), an angle in the first plane defined by the first direction (X) 116 (FIG. 1) and the second direction (Y) 118 (FIG. 1), an angle in a second plane defined by the first direction (X) 116 (FIG. 1) and the third direction (Z), and an angle in a third plane defined by the second direction (Y) 118 (FIG. 1) and the third direction (Z). Note that if a surface, such as the surface 208-1, of either of the adjacent semiconductor dies 110 is non-planar (for example, due to quadrupole distortion), additional alignment problems may be introduced.

In some embodiments, allowed misalignment in the first direction (X) 116 (FIG. 1), the second direction (Y) 118 (FIG. 1) and/or the third direction (Z) is less than one half of the pitch 114 between adjacent pads 112. For example, misalignment in the first direction (X) 116 (FIG. 1) and/or the second direction (Y) 118 (FIG. 1) may be less than 25 μm, and the misalignment 214 in the third direction (Z) may be less than 5 μm.

In the embodiments described below, the proximity connectors 112 on the adjacent semiconductor dies 110 utilize capacitive coupling and/or a number of data signal channels for inter-chip communication. In other embodiments, additional connectors may be overlapped on adjacent semiconductor dies 110.

One embodiment of the present invention uses magnetic proximity connectors, where data signals are communicated magnetically between terminals on closely adjacent semiconductor dies 110. Another embodiment uses optical proximity connectors, where data signals are communicated optically between terminals on adjacent semiconductor dies 110. Yet another embodiment couples connectors in adjacent semiconductor dies 110 using an array of solder balls.

While the device 100 (FIG. 1) and the system 200 are illustrated as having a number of components in a given configuration, in other embodiments the device 100 (FIG. 1) and/or the system 200 may include fewer components or additional components, two or more components may be combined into a single component, and/or a position of one or more components may be changed.

Figure 3A:
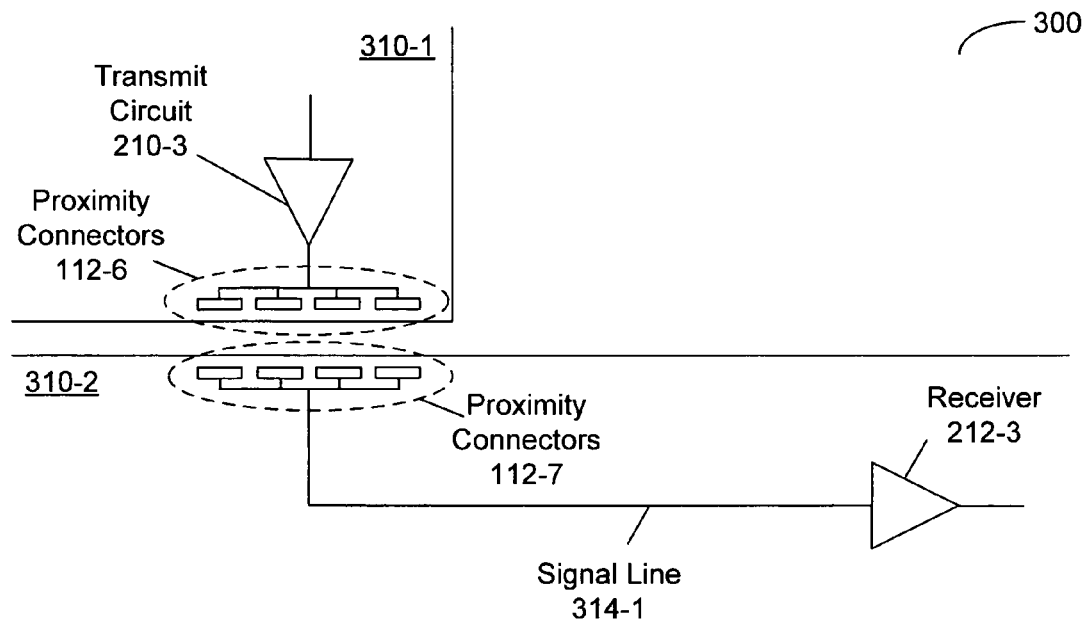
FIG. 3A is a block diagram illustrating an embodiment of a system that includes devices that communicate using proximity communication.

FIG. 3A is a block diagram illustrating an embodiment of a system 300 that includes devices 310 that communicates using proximity communication. In contrast with the system 200 (FIG. 2), receive circuit 212-3 is coupled to proximity connectors 112-7 by a relatively long wire or signal line 314-1. In some embodiments, signal lines 314 longer than 1, 5, 10, and/or 25 mm are considered long. As discussed previously, such signal lines 314 may have appreciable resistance and capacitance, and possibly inductance, which may degrade edge rates, increase latency, and/or lower the data rate in the communication channel.

Figure 3B:
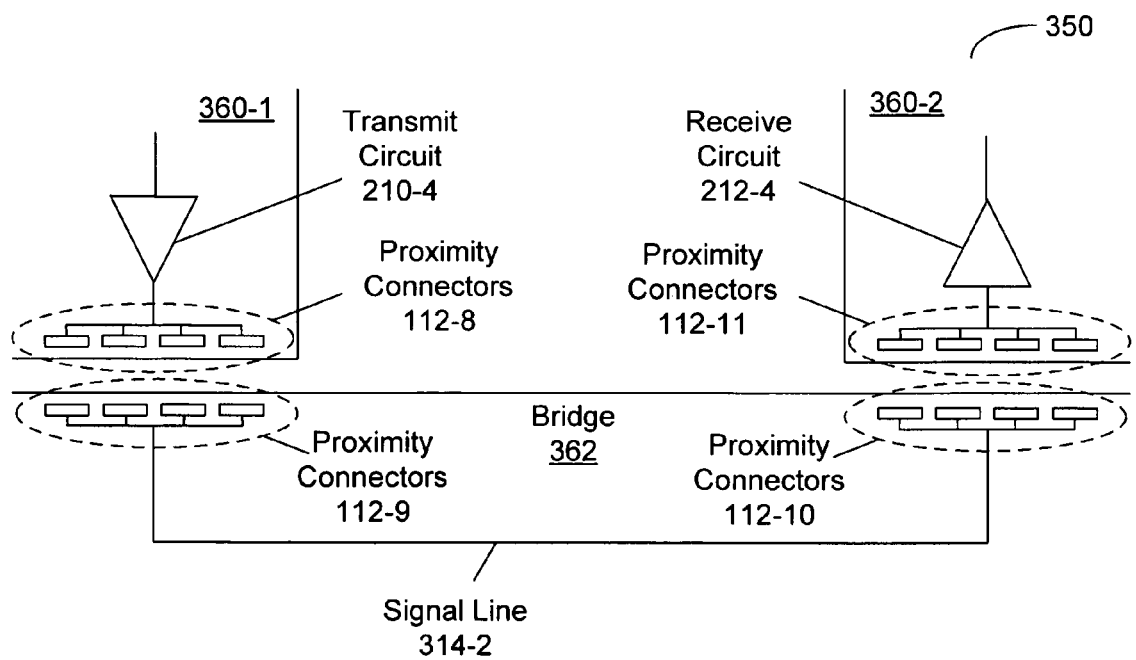
FIG. 3B is a block diagram illustrating an embodiment of a system that includes devices that communicate using proximity communication.
Figure 4:
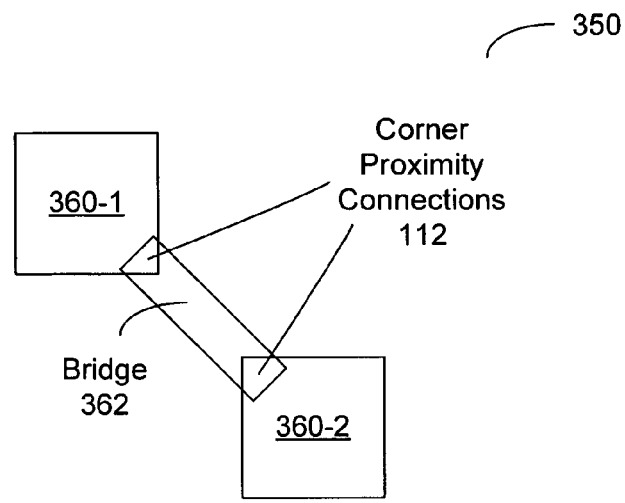
FIG. 4 is a block diagram illustrating an embodiment of a system that includes devices that communicate using proximity communication.

FIG. 3B is a block diagram illustrating an embodiment of a system 350 that includes devices 360 that communicates using proximity communication via a bridge chip 362. As further illustrated in FIG. 4, bridge chip 362 couples corner proximity connectors 112 on the devices 360. Referring back to FIG. 3B, the bridge chip 362 may not have any receive circuits at all. Instead, proximity connectors or pads 112-9 are connected to a long wire or signal line 314-2 that spans the bridge chip 362 and is connected to additional proximity connectors or pads 112-10. The bridge chip 362 is sometimes referred to as a "passive bridge," because it bridges two devices 360 using proximity communication but has no active circuits of its own. In such a bridge chip, the long lossy wire or signal line 314-2 connecting the receiver pads 112-9 to the transmitter pads 112-10 may present a large load to the communication channel in the proximity communication system 350, thereby degrading performance.

Figure 5:
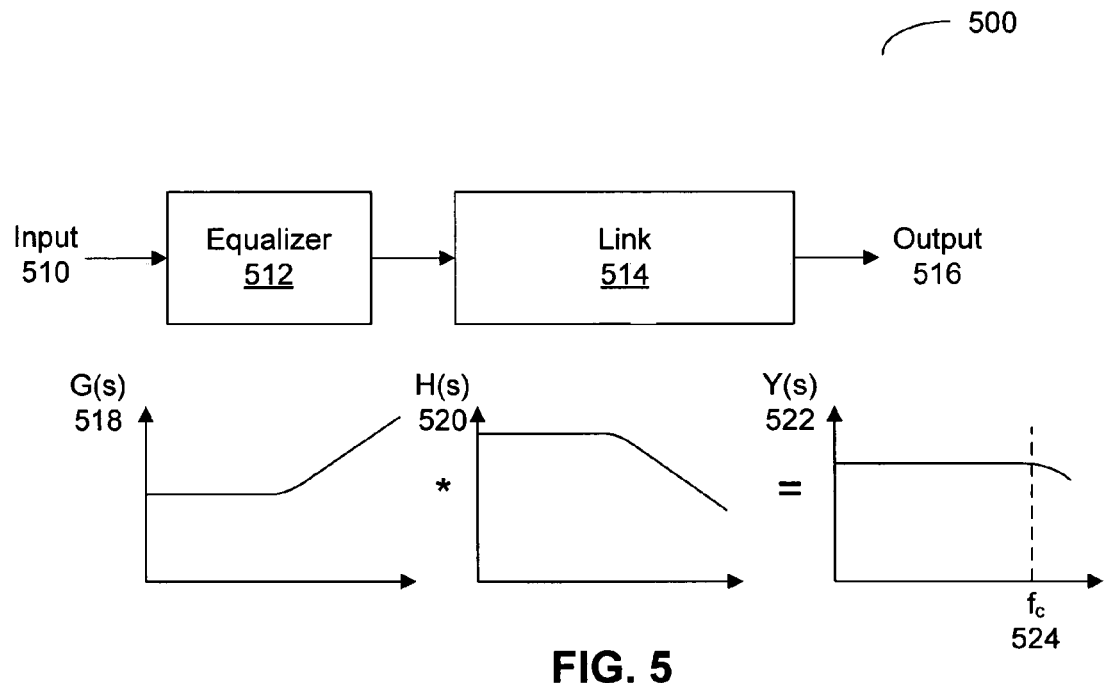
FIG. 5 is a block diagram illustrating an embodiment of a communication channel that includes equalization.

By using equalization, losses in the communication channel may be reduced and/or eliminated, and thus the performance of the proximity communication systems may be improved. This is illustrated in FIG. 5, which shows an embodiment of a communication channel 500 that includes equalization. In this embodiment, input data or signals 510 having a frequency response $X(s)$ may be input to an equalizer 512 having a frequency response $G(s)$ 518. Moreover, the equalizer 512 may be coupled to a link 514 having a frequency response $H(s)$ 520, and the link 514 may include proximity connectors 112 (FIG. 2) on adjacent semiconductor dies 110 (FIG. 2) that are capacitively coupled. Furthermore, output data or signals 516 having a frequency response $Y(s)$ 522 may be output from the link 514.

Without compensation, the frequency response $H(s)$ 520 of the link 514 may reduce the performance of the communication channel 500. For example, attenuation of some frequencies may give rise to inter-symbol interference. A typical link 514 may have a low-pass frequency response, in which frequencies below a cutoff frequency are passed unaltered and frequencies above the cutoff frequency are attenuated. If the input 510 includes a long sequence of logical high values (such as +1s), the output 516 is eventually driven to an extremum value. In the frequency domain, this corresponds to a low frequency signal. If the input 510 then has one or more logical low values, there may not be sufficient time for the output 516 to be driven to a neutral level (such as GND) before being driven to a value corresponding to a logical low. As a consequence, even if the input 510 remains low for several bit periods, the output 516 corresponding to the logical low may be attenuated. In essence, the previous logical high interferes with the subsequent logical low and the high frequency content in the input 510 is attenuated.

The frequency response $G(s)$ 518 of the equalizer 512 may be used to correct for such effects. In particular, the frequency response $G(s)$ 518 may be selected, determined and/or adapted such that the product of the frequency response $G(s)$ 518 and the frequency response $H(s)$ 520 may result in the frequency response $Y(s)$ 522 of the output data or signals 516 that improves the performance of the communication channel 500. For example, a magnitude and/or phase of the frequency response $Y(s)$ 522 may be approximately uniform or constant over a range of frequencies, such as between DC (or approximately near DC) and a cut-off frequency $f_c$ 524. This may reduce and/or eliminate the afore-mention inter-symbol interference. The range of frequencies in $Y(s)$ 522 that have an approximately uniform or constant magnitude may include the frequencies in $X(s)$ that correspond to the input data or signals 510. In some embodiments, variation in the magnitude of the frequency response $Y(s)$ 522 within the range of frequencies may be less than 3 dB of an average or a peak of the magnitude of the frequency response $Y(s)$ 522. The average or peak of the magnitude of the frequency response $Y(s)$ 522 may be within the range of frequencies. Note that the improved performance of the communication channel 500 may allow the data rate to be increased and/or a power consumption of a transmit circuit (for example, a transmit driver) to be reduced while maintaining the bit error rate.

In FIG. 5, communication channel 500 illustrates the equalizer 512 preceding the link 514. This corresponds to pre-emphasis, where the equalizer 512 boosts certain frequency content of signals (typically, the higher frequency content) to compensate for the frequency response of the link 514, which may cause a roll-off or attenuation at high frequencies. (Equalization in the transmit circuits 210 (FIG. 2) is described further below with reference to FIG. 8.) In other embodiments, equalizer 512 may be implemented after the link 514. This approach may use less energy, since signals with reduced amplitude may be transmitted through the link 514. Thus, equalization may be implemented on the transmit side and/or the receive side of the communication channel.

The communication channel 500 may include fewer components or additional components. For example, in some embodiments the equalizer 512 may be implemented as two or more filters. Furthermore, two or more components in the communication channel 500 may be combined into a single component, and a position of one or more components may be changed.

Figure 6:
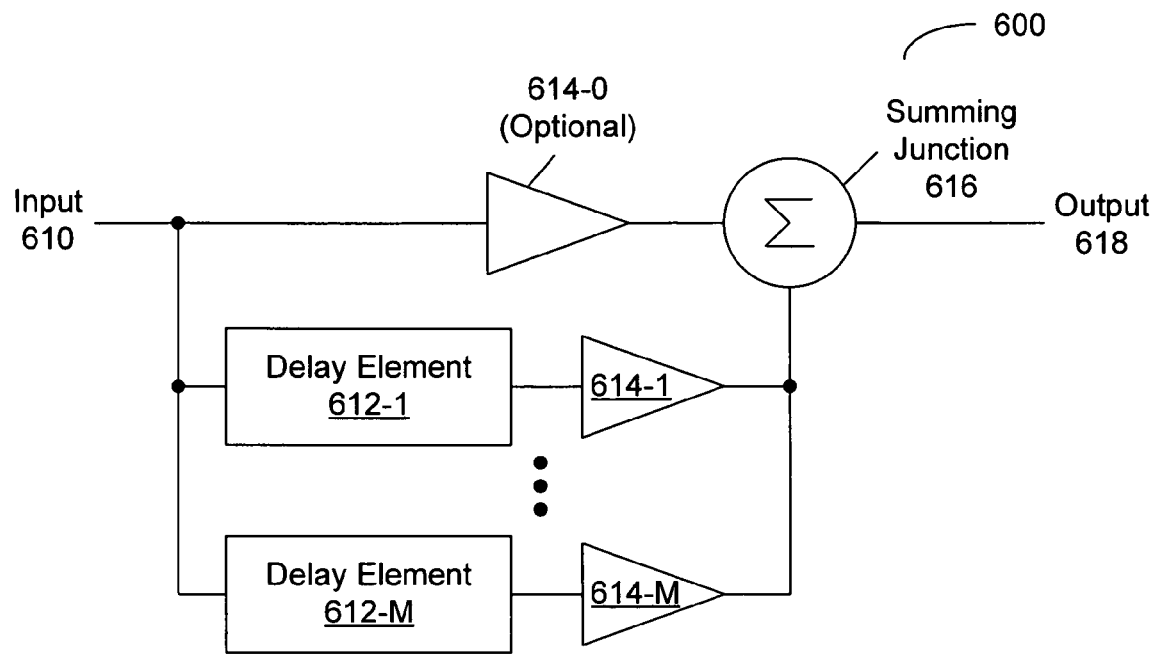
FIG. 6 is a block diagram illustrating an embodiment of a finite impulse response (FIR) filter.

The equalizers 512 may include one or more filters, including a finite impulse response (FIR) filter and/or an infinite impulse response (IIR) filter. More specifically, FIG. 6 is a block diagram illustrating an embodiment of an FIR filter 600 having M parallel paths or taps, wherein an input 610 is coupled to the M taps. With exception of tap 0, a respective tap includes a delay element 612 and a weight 614. In some embodiments, tap 0 (i.e., the tap without a delay element 612) includes an optional weight 614-0. Signals from the M taps may be combined in a summing junction 616 to produce an output 618. The output 618, therefore, is a weighted summation of previous and current signals in the input 610. With sufficient taps, a filter, such as the filter 600, may approximate an arbitrary frequency response.

Note that filter 600 may include fewer components or additional components, two or more components may be combined into a single component, and/or a position of one or more components may be changed. For example, an order of the delay elements 612 and the weights 614 may be reversed in one or more of the taps.

As discussed further below with reference to FIG. 8, a wide variety of components may be used to implement filters, such as the filter 600. However, the use of voltage-mode drivers (voltage-mode signaling) complicates the implementation of the summing junction 616.

Many high-speed inter-chip communication channels use a technique known as "current-mode signaling." In this approach, data that is to be communicated is encoded using current levels. For example, a current of +50 mA may denote a logical high and a current of −50 mA may denote a logical low. Furthermore, the summing junction 616 may sum currents, for example, by tying outputs from current sources in different taps directly to a common conductor.

As noted previously, for proximity communication voltage-mode signaling is often used. In this approach, data that is to be communicated may be encoded using two or more voltage levels. For example, a voltage of +1 V may denote a logical high and a voltage of 0 V may denote a logical low. Other embodiments may utilize additional voltage levels, such as in multiple-pulse amplitude modulation (multi-PAM). When the transmit drivers in the transmit circuits 210 (FIG. 2) are voltage-mode drivers, i.e., when they utilize voltage-mode signaling, the summing junction 616 may not be implemented by simply tying the outputs of multiple drivers in different taps to a common conductor. To address this challenge, active circuitry to appropriately sum the voltages from different taps may be used. This approach, however, may increase the complexity and power consumption of the proximity communication system.

Since proximity communication employs capacitive coupling between transmit circuits 210 (FIG. 2) and receive circuits 212 (FIG. 2), a summing junction 616 may be implemented by aggregating the multiple proximity connectors 112 (FIG. 2). In particular, proximity connectors 112 (FIG. 2) that are coupled to transmit circuits 210 (FIG. 2) that are transmitting data in a first of the semiconductor dies 110 (FIG. 2) may be aggregated with one or more of the proximity connectors 112 (FIG. 2) that are receiving the data in a second of the semiconductor dies 110 (FIG. 2). In this way, the received signal is the sum of the capacitively coupled charge from the transmit circuits 210 (FIG. 2) that are being used.

Figure 7:
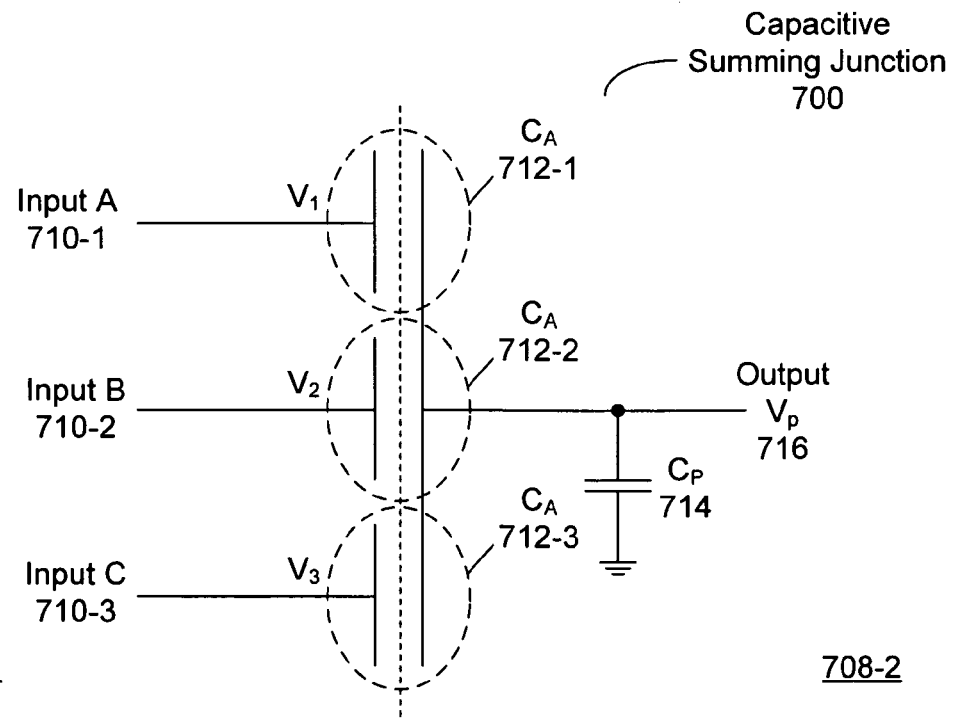
FIG. 7 is a block diagram illustrating an embodiment of a capacitive-summing junction.

An embodiment of a capacitive- (voltage-) summing junction 700 for use in a filter, such as the filter 600 (FIG. 6), is illustrated in FIG. 7. As illustrated in FIG. 7, inputs 710 may be coupled to transmit circuits 210 (FIG. 2) in a semiconductor die 708-1 that is transmitting the data. Moreover, the inputs 710 may be coupled, via proximity connectors 112 (FIG. 2), to at least one of the proximity connectors 112 (FIG. 2) in a semiconductor die 708-2 that is receiving the data. The capacitively coupled proximity connectors 112 (FIG. 2) may include a plurality of capacitors having capacitances $C_i$ 712. Note that at least the one of the proximity connectors 112 (FIG. 2) in the semiconductor die 708-2 may be coupled to one of the receive circuits 212 (FIG. 2). Furthermore, the one of the receive circuits 212 (FIG. 2) may have a capacitance $C_p$ 714 to ground at its input.

An output $V_p$ 716 from the capacitive-summing junction 700 may be determined by the divider defined by the sum of the capacitances $C_i$ 712 and the capacitance $C_p$ 714 to ground. In particular, the output $V_p$ 716 may be expressed as $$V_p = \frac{\sum_{i=1}^{M} C_i \cdot V_i}{C_p + \sum_{i=1}^{M} C_i},$$

Where $V_i$ are the voltages on the inputs 710 and M is a number of inputs 710. The output voltage $V_p$ 716 is a weighted average of the voltages $V_i$, with the relative weights set by the capacitances $C_i$ 712 relative to the total capacitance.

The inputs 710, therefore, may correspond to a number of taps that are included in a filter, such as the filter 600 (FIG. 6), or a number of taps in a filter that have a non-zero weight element 614. As discussed further below with reference to FIGS. 8, 9A and 9B, the relative weights (i.e., the weights of the weight elements 614 in FIG. 6) may be implemented by varying or changing a number of proximity connectors 112 (FIG. 2) that are coupled to the inputs 710.

Thus, for proximity communication with voltage-mode signaling, the summing junction 616 (FIG. 6) may be implemented by coupling multiple proximity connectors 112 (FIG. 2) in the semiconductor die 708-1 to at least one of the proximity connectors 112 (FIG. 2) in the semiconductor die 708-2. In other embodiments, there may be one of more instances of coupling a set of proximity connectors 112 (FIG. 2) in the semiconductor die 708-1 to a corresponding one of the proximity connectors 112 (FIG. 2) in the semiconductor die 708-2. For example, a first set may be coupled to a first proximity connector and a second set may be coupled to a second proximity connector, etc.

In some embodiments, the capacitive-summing junction 700 may be implemented using on-chip wires or signal lines that are proximate to one another. In some embodiments, the capacitive-summing junction 700 may be implemented using alternate metal layers or with metal layers that are wrapped around a wire or signal line. The capacitive-summing junction 700, therefore, may include fewer components or additional components, two or more components may be combined into a single component, and/or a position of one or more components may be changed.

Figure 8:
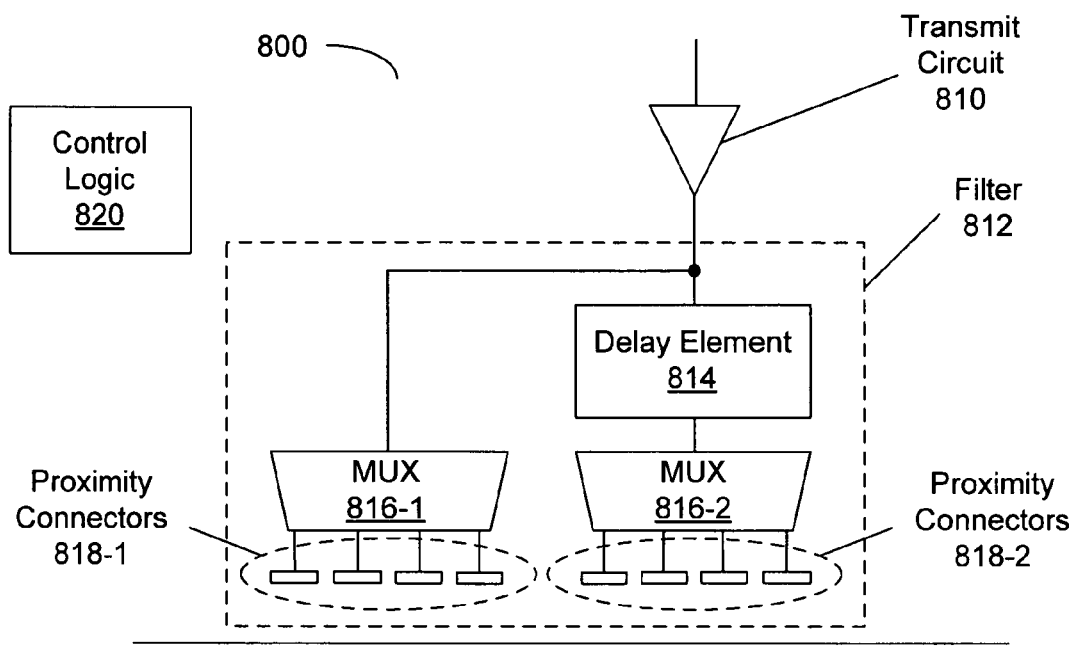
FIG. 8 is a block diagram illustrating an embodiment of a device that includes a filter.

FIG. 8 is a block diagram illustrating an embodiment of a device 800 that includes a filter 812, which may be at least a portion of an equalizer. In this embodiment, transmit circuit 810 may be selectively coupled to proximity connectors 818-1 via a multiplexer 816-1, and may also be coupled to a delay element 814 and selectively coupled to proximity connectors 818-2 via a multiplexer 816-2.

Delay element 814 (and/or the delay elements 612 in FIG. 6) may have a discrete time delay (such as one or more cascaded flip flops and/or latches) and/or a continuous time delay (such as a delay line and/or a chain of one or more buffers). Moreover, delay element 814 (and/or the delay elements 612 in FIG. 6) may be configured to be clocked using a clock signal that has a frequency that is different from a chip rate (i.e., a number of bits or symbols per second) of the transmit circuit 810. In some embodiments, the delay element 814 (and/or the delay elements 612 in FIG. 6) may be configured to be clocked using a clock signal that corresponds to the chip rate.

In filter 812, weights for one or more taps may be varied or changed by selectively coupling fewer or more proximity connectors 818 to the transmit circuit 810. Such a digital capacitor may allow a wide range of capacitance values to be obtained. In other embodiments, weight elements (not shown), such as the weight elements 614 (FIG. 6), that have fixed and/or adjustable weights may be included in one or more taps in the filter 812. These weight elements may include elements that have a nonlinear relationship between capacitance and control voltage (such as veractors and/or transistors). For example, in an active device such as a metal oxide semiconductor (MOS) transistor, the capacitance may be modified by adjusting a bias level in the MOS capacitor and/or by changing the body voltage. In some embodiments, a weight of the respective weight element may be adjusted by changing a voltage swing and/or a slew rate. Two or more of the afore-mentioned approaches may be used in filters, such as the filter 812.

The device 800 may include control logic 820. The control logic 820 may be configured to adjust a frequency response of the filter 812 and/or an associated equalizer in accordance with a performance metric of the communication channel. The adjustment may use a least mean squares (relative to an equalization target response) and/or or a binary search technique. The adjustment may change a number of taps, one or more delays, and/or one or more weights (including one or more signs) in the filter 812. For example, the filter 812 may initially include one tap (tap 0) that is coupled between the input and the output of the filter 812. Based on the performance metric, one or more additional taps may be added and the corresponding delays and/or weights may be modified in accordance with an algorithm in the control logic 820. Such flexibility may allow the filter 812 to accommodate process variation in one or more characteristics of the device 800, and may improve operating margins, reduce power and/or improve proximity communication system performance.

The performance metric may include equality and/or a difference between a sequence received by one or more of the receive circuits 212 (FIG. 2). This may involve a threshold detector and a pre-determined sequence or test sequence that is transmitted by the transmit circuit 810. Note that the pre-determined sequence may include a pseudo-random sequence. In an exemplary embodiment, the pseudo-random sequence may have between $2^7-1$ and $2^{31}-1$ bits.

In some embodiments, the frequency response of the filter 812 and/or the associated equalizer may be static. In some embodiments, the control logic 820 may be configured to determine, select and/or adjust the frequency response when the device 800 is powered on. In some embodiments, the control logic 820 may be configured to determine, select and/or adjust the frequency response after at least a pre-determined time interval since a last adjustment or modification of the filter 812 and/or the associated equalizer. In an exemplary embodiment, the pre-determined time interval is approximately between 1 μs and 1 s. In some embodiments, the control logic 820 may be configured to determine, select and/or adjust the frequency response continuously. In some embodiments, the control logic 820 may be configured to determine, select and/or adjust the frequency response one-time, such as in a factory. In these embodiments, the control logic 820 may be external to the device 800. Control logic 820 may also be coupled to the device 800 using probe pads when one or more semiconductor dies 110 (FIG. 2) that are included in the device 800 are at a die or wafer level.

In an illustrative embodiment, the device 800 may be coupled to another device (such as the device 310-2 in FIG. 3A) that includes a signal line (such as the signal line 314-1 in FIG. 3A) that is 14 mm long and 0.5 μm wide. A bandwidth of the corresponding communication channel may be 200 MHz. A filter, such as the filter 812, that includes a second tap (in addition to tap 0) that has a delay element with a 1.5 ns delay and a weight element with a weight of 0.3 (relative to tap 0) may increase the bandwidth to 400 MHz.

Note that in another illustrative embodiment, if 180 nm technology is used, an RC time constant of the communication channel is 20 ps, and if slew rate control does not limit a bandwidth of the communication channel, the use of an equalizer with a filter, such as the filter 812, may increase a bandwidth of the communication channel from 50 GHz to 100 GHz.

The device 800 may include fewer components or additional components, two or more components may be combined into a single component, and/or a position of one or more components may be changed. For example, the filter 812 may include fewer or additional taps.

As discussed previously, devices, such as the device 800, may use a plurality of proximity connectors 818 to correct for misalignment in the first plane. In some embodiments, a plurality of micro-proximity pads or connectors may be utilized in the transmitter side and/or the receiver side of the communication channel. As an illustration, in the discussion that follows the transmitter side includes a plurality of micro-proximity connectors and the receiver side includes 'full-sized' proximity connectors. This parallels the discussion of the capacitive-summing junction 700 in FIG. 7. The micro-proximity connectors may be selectively coupled to taps in a filter, such as the filter 812, thereby adjusting one or more weights.

Figure 9A:
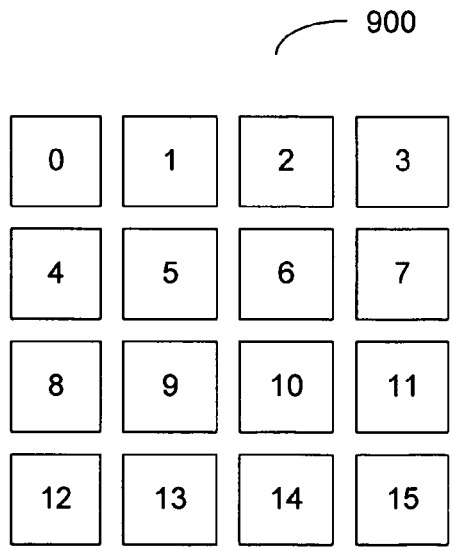
FIG. 9A is a block diagram illustrating an embodiment of an array of micro-proximity connectors.

FIG. 9A is a block diagram illustrating an embodiment of an array 900 of micro-proximity connectors. As illustrated in FIG. 9A, a ratio of 16 micro-proximity connectors on the transmitter side to one full-sized proximity connector on the receiver side means that a respective transmit proximity connector includes a 4×4 array 900 of smaller (micro-) proximity connectors that all may drive a common value. A 32-bit bus would, therefore, use 512 (32×16) such micro-proximity connectors that are chosen from a larger array of perhaps 612 (34×18) total micro-proximity connectors. While a ratio of 16 micro-proximity connectors on the transmitter side to a full-sized proximity connector on the receiver side is used as an illustration, in other embodiments the ratio may include between 4 and 100 micro-proximity connectors to a full-sized proximity connector.

After neighboring devices, such as the device 800 (FIG. 8), have been electronically aligned, with signals corresponding to the data bits steered to the appropriate transmission micro-proximity connectors in accordance with the alignment in the first plane, the array 900 of 16 transmit micro-proximity connectors may be subdivided and coupled to (a) signals corresponding to immediate (current) data bit and (b) one or more prior data bits. That is, some of the micro-proximity connectors may transmit signals corresponding to the immediate data bit and some may transmit signals corresponding to one or more prior data bits. Depending on how the total number of micro-proximity connectors (16 in this example) are assigned to the immediate data bit and the one or more prior data bits will determine the relative weighting of these taps in a filter, such as the filter 812 (FIG. 8).

Figure 9B:
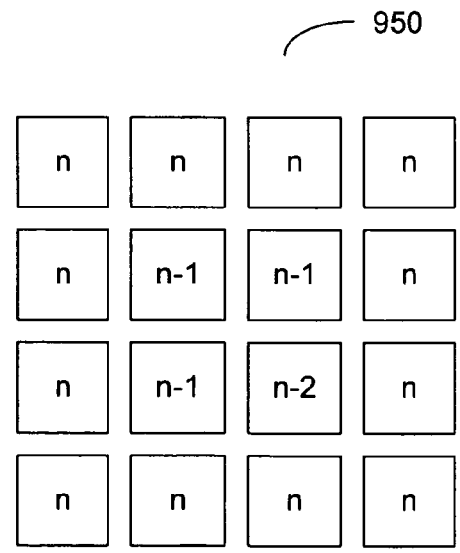
FIG. 9B is a block diagram illustrating an embodiment of an array of micro-proximity connectors.

FIG. 9B is a block diagram illustrating an embodiment of an array 950 of micro-proximity connectors. The outer 12 micro-proximity connectors drive signals corresponding to the immediate data bit (n) and the inner 4 micro-proximity connectors drive signals corresponding to prior data bits. In this example, the inner 4 micro-proximity connectors are divided into a group of 3 micro-proximity connectors that drive signals corresponding to a previous data bit (n−1) and one micro-proximity connector that drives signals corresponding to a data bit from two clock transitions or clock periods ago (n−2). This may correspond to an FIR filter that has weights of $^{12}/_{16}$, $^{3}/_{16}$, and $^{1}/_{16}$, respectively.

It is worth noting that an area on a device, such as the device 800 (FIG. 8), corresponding to a filter may not be trivial. Each micro-proximity connector may be selectively coupled in accordance with a statically set control bit that assigns the micro-proximity connector to signals corresponding to the immediate data bit or one of the prior data bits. In some embodiments, a Joint Test Action Group (JTAG)/scan bit may be used to implement this functionality. In addition, depending on a depth of the filter, each micro-proximity connector may have one or more associated flip-flops. And, as discussed further below with reference to FIG. 10, each micro-proximity connector may have an associated sign-adjustment element to set a polarity of the corresponding weight. Note that the resulting total area may be relatively large, and may impede devices that include very many small micro-proximity connectors. An exemplary embodiment that addresses these space and complexity constraints may have an array, such as the array 900 (FIG. 9A), that has between 2×2 and 10×10 micro-proximity connectors per each full-sized proximity connector.

Referring to array 950, note that micro-proximity connectors on edge or border of the array 950 may be used for the signals corresponding to the primary or immediate data bit. Proximity connectors that are coupled signals corresponding to prior data bits may be in a region that is surrounded by these border micro-proximity connectors. This configuration may be advantageous since crosstalk between proximity connectors may occur predominantly along the outside border of the array 950. In particular, by making the signals for all of the border micro-proximity connectors uniform the principal pathway for data crosstalk with neighboring arrays may be reduced and/or eliminated by using a differential and alternating arrangement for this border value in the neighboring arrays. This approach, however, may place constraints on possible weights in the filter. For example, the tap that corresponds to the immediate data bit (typically, tap 0) will have a weight of at least $^{12}/_{16}$ in a device that has a ratio of 16 micro-proximity connectors to a full-sized proximity connector.

Figure 10:
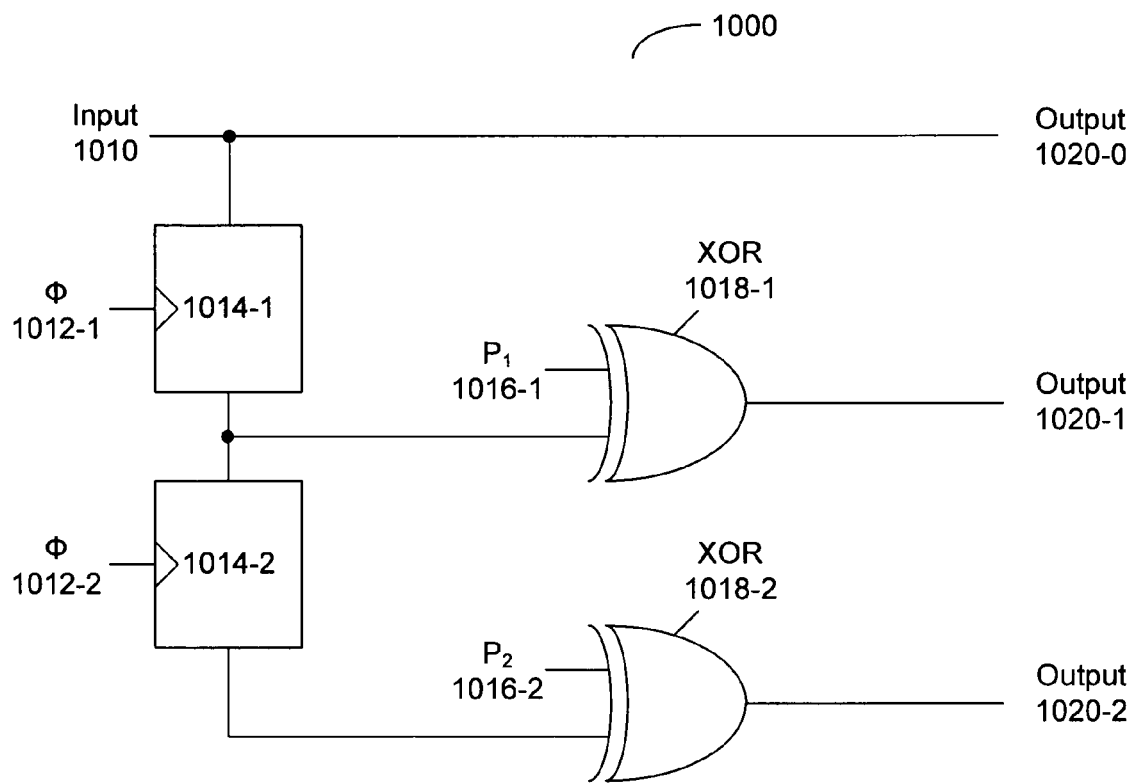
FIG. 10 is a block diagram illustrating an embodiment of a portion of a filter that includes sign-adjustment elements.

As noted above, in some embodiments at least some of the signals that correspond to prior data bits may be inverted using sign-adjustment elements thereby implementing negative weights. For example, at least some of the signals that correspond to the prior data bits may be XORed with one or more polarity or control signals. This is illustrated in FIG. 10, which presents a block diagram of an embodiment of a portion of a filter 1000 that includes sign-adjustment elements 1018. In the portion of the filter 1000, an input 1010 is coupled to outputs 1020 on a series of parallel paths or taps. With the exception of tap 0, a respective tap includes at least one delay element, such as delay element 1014-1, and a respective sign-adjustment element, such as sign-adjustment element 1018-1. In an exemplary embodiment, the delay elements 1014 include flip-flops or latches that are clocked by clock signals φ 1012 and the sign-adjustment elements 1018 include XOR gates that have polarity signals $P_i$ 1016 as one of their inputs. A sign of the output, such as output 1020-1, for a respective tap may be modified in accordance with a respective polarity signal, such as polarity signal $P_1$ 1016-1.

The portion of the filter 1000 may include fewer components or additional components, two or more components may be combined into a single component, and/or a position of one or more components may be changed. For example, the portion of the filter 1000 may include fewer or additional taps, a capacitive-summing junction, and/or weight elements.

Figure 11:
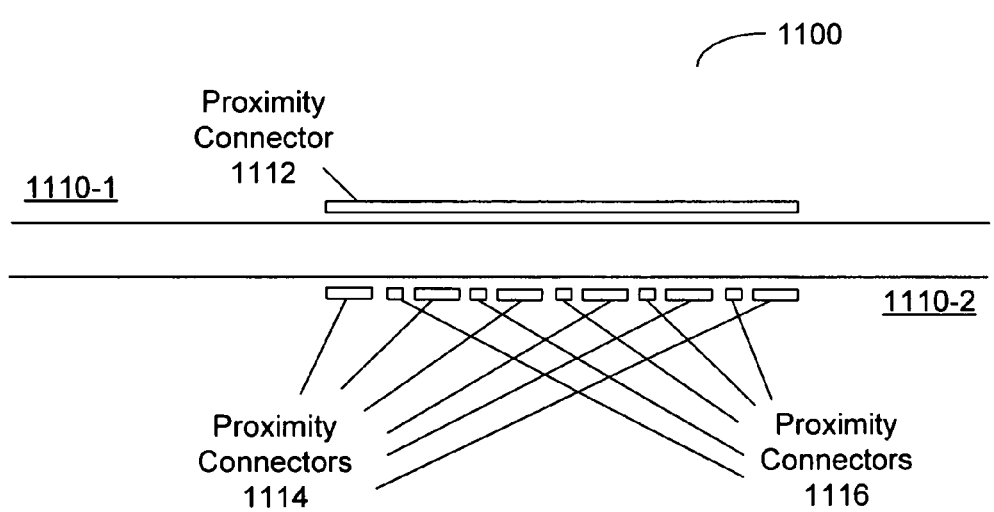
FIG. 11 is a block diagram illustrating an embodiment of a system that includes devices that communicate using different-sized proximity connectors.

In some embodiments, different-sized proximity connectors may be used for different taps in a filter. This is illustrated in FIG. 11, which presents an embodiment of a system 1100 that includes devices 1110 that communicate using different-sized proximity connectors. In FIG. 11, device 1110-1 may receive signals using proximity connector 1112, and device 1110-2 may transmit and equalize signals using proximity connectors 1114 and 1116. Proximity connectors 1114 may have a larger area than proximity connectors 1116. Furthermore, proximity connectors 1114 may be used for tap 0 in the filter (i.e., for the signals that correspond to the immediate data bit) and proximity connectors 1116 may be used for higher-order taps (i.e., for the signals that correspond to one or more prior data bits).

The fringe electric fields associated with the different-sized proximity connectors may, at least in part, inherently adapt the equalization as the misalignment 214 (FIG. 2) changes. Note that the bandwidth of the communication channel may be determined from a gain-bandwidth product for the proximity communication system. When the misalignment 214 (FIG. 2) is small (i.e., the semiconductor dies 110 in FIG. 2 are almost touching), the gain is larger and, therefore, the bandwidth is smaller. As discussed previously, a small bandwidth (i.e., a larger attenuation of high-frequency signals) may be compensated for using equalization. When the misalignment 214 (FIG. 2) is large, however, the gain is reduced and, therefore, the bandwidth is increased. In this case, less equalization may be used. The fringe fields associated with proximity connectors, such as the proximity connectors 1116, that have a smaller area or size will fall off more rapidly with distance, effectively reducing the capacitance or weight for these proximity connectors in the corresponding capacitive-summing junction. Therefore, if these proximity connectors are coupled to signals that correspond to prior data bits, the equalization will be reduced as the misalignment 214 (FIG. 2) increases.

Note that the system 1100 may include fewer components or additional components, two or more components may be combined into a single component, and/or a position of one or more components may be changed. For example, there may be more than two sizes or areas for the proximity connectors in the device 1110-2.

While the preceding discussion has focused on equalization embodiments, in other embodiments one or more filters, such as the filter 812 (FIG. 8), may be used to reduce crosstalk between signal paths that include at least two proximity connectors 112 (FIG. 2) in the plurality of proximity connectors 112 (FIG. 2). For example, when a respective proximity connector is transmitting a signal, parasitic capacitance with neighboring proximity connectors 112 (FIG. 2) may give rise to interference signals on these proximity connectors 112 (FIG. 2). These interference signals may be reduced and/or eliminated by applying an appropriate signal to the affected proximity connectors 112 (FIG. 2) to cancel the effect of the crosstalk.

Attention is now directed towards methods for communicating signals. FIG. 12 presents a flow chart illustrating an embodiment of a process 1200 for communicating signals. During this process, signals are communicated between semiconductor dies using proximity connectors that are capacitively coupled (1210), and the signals are communicated using voltage-mode signaling. While communicating the signals, the signals may be equalized using a filter that includes a capacitive-summing junction (1212). In some embodiments, there may be additional or fewer operations, the order of the operations may be changed, and two or more operations may be combined into a single operation.

Figure 13:
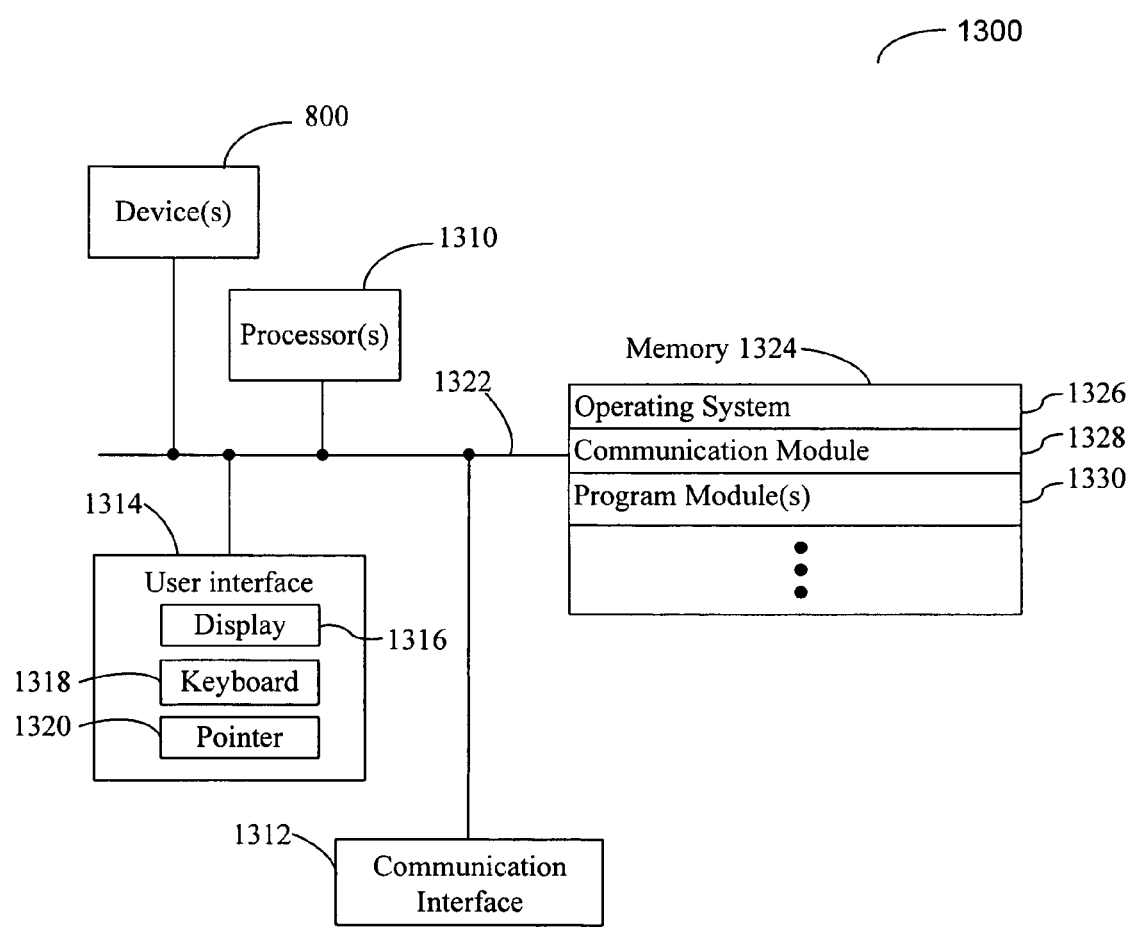
FIG. 13 is a block diagram illustrating an embodiment of a computer system.

The present invention may include one or more circuits that include equalization in capacitively coupled proximity communication systems. For example, FIG. 13 presents a block diagram illustrating an embodiment of a computer system 1300, which includes one or processors 1310, a communication interface 1312, a user interface 1314, and one or more signal lines 1322 coupling these components together. Note that the one or more processing units 1310 may support parallel processing and/or multi-threaded operation, the communication interface 1312 may have a persistent communication connection, and the one or more signal lines 1322 may constitute a communication bus. Moreover, the user interface 1314 may include a display 1316, a keyboard 1318, and/or a pointer, such as a mouse 1320.

The computer system 1300 may include memory 1324, which may include high speed random access memory and/or non-volatile memory. More specifically, memory 1324 may include ROM, RAM, EPROM, EEPROM, FLASH, one or more smart cards, one or more magnetic disc storage devices, and/or one or more optical storage devices. Memory 1324 may store an operating system 1326, such as LINUX, UNIX, OS X, or WINDOWS, that includes procedures (or a set of instructions) for handling various basic system services for performing hardware dependent tasks. The memory 1324 may also store procedures (or a set of instructions) in a communication module 1328. The communication procedures may be used for communicating with one or more computers and/or servers, including computers and/or servers that are remotely located with respect to the computer system 1300.

Memory 1324 may also include the one or more program modules (of sets of instructions) 1330. Instructions in the program modules 1330 in the memory 1324 may be implemented in a high-level procedural language, an object-oriented programming language, and/or in an assembly or machine language. The programming language may be complied or interpreted, i.e, configurable or configured to be executed by the one or more processing units 1310.

The computer system 1300 may include one or more devices 800, SCMs, and/or MCMs that include the previously described proximity communication embodiments that have equalization to improve communication channel performance. While not shown in the computer system 1300, in some embodiments, such circuits may be included in the one or processors 1310.

The computer system 1300 may include fewer components or additional components, two or more components may be combined into a single component, and/or a position of one or more components may be changed. In some embodiments, implementation of functionality of the computer system 1300 may be implemented more in hardware and less in software, or less in hardware and more in software, as is known in the art.

Although the computer system 1300 is illustrated as having a number of discrete items, FIG. 13 is intended to be a functional description of the various features which may be present in the computer system 1300 rather than as a structural schematic of the embodiments described herein. In practice, and as recognized by those of ordinary skill in the art, the functions of the computer system 1300 may be distributed over a large number of servers or computers, with various groups of the servers or computers performing particular subsets of the functions. In some embodiments, some or all of the functionality of the computer system 1300 may be implemented in one or more application specific integrated circuits (ASICs) and/or one or more digital signal processors (DSPs).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A device, comprising:
   a semiconductor die having a surface;
   a plurality of proximity connectors proximate to the surface, wherein the semiconductor die is configured to communicate signals by capacitive coupling using one or more of the plurality of proximity connectors; and
   a circuit coupled to at least one of the plurality of proximity connectors, wherein the circuit is configured to communicate signals using voltage-mode signaling, wherein the circuit includes a filter to equalize the signals, and wherein the filter includes a capacitive-summing junction;
   at least one delay element in the filter;
   wherein the plurality of proximity connectors includes a first set of the proximity connectors that communicates current data and a second set of the proximity connectors that communicates data that was delayed by the delay element, wherein the first and second sets include different ones of the proximity connectors.

2. The device of claim 1, wherein the circuit includes a transmit circuit.

3. The device of claim 1, wherein one or more of the plurality of proximity connectors are included in the capacitive-summing junction.

4. The device of claim 1, wherein the filter is configured to reduce cross-talk between signal paths that include at least two proximity connectors in the plurality of proximity connectors.

5. The device of claim 1, wherein the filter is configured to provide pre-emphasis to the signals.

6. The device of claim 1, wherein an output voltage from the filter is a weighted-average of voltages from taps in the filter, and wherein a respective weight corresponds to a respective capacitance of a respective tap in the filter.

7. The device of claim 6, wherein the respective capacitance corresponds to a number of proximity connectors in the plurality of proximity connectors that are selectively coupled to the respective tap.

8. The device of claim 6, wherein the respective tap includes a sign-adjustment element.

9. The device of claim 6, wherein proximity connectors corresponding to one or more taps that have time delays relative to a first tap are in a region, and proximity connectors corresponding to the first tap are positioned around a border of the region.

10. The device of claim 6, wherein proximity connectors corresponding to one or more taps that have time delays relative to a first tap have respective areas that are less than an area of proximity connectors that correspond to the first tap.

11. The device of claim 1, wherein the filter includes a finite impulse response (FIR) filter.

12. The device of claim 1, further including control logic, wherein the control logic is configured to adjust a frequency response of the filter in accordance with a performance metric of a communication channel that includes the device and another device.

13. The device of claim 12, wherein the control logic is configured to adjust the frequency response at least one of: when the device is powered on; after at least a pre-determined time interval since a last adjustment; and continuously.

14. The device of claim 12, wherein the performance metric includes a difference between a sequence received by the other device and a pre-determined sequence.

15. The device of claim 1, wherein the filter includes delay elements that have discrete time delays.

16. The device of claim 15, wherein the delay elements are configured to be clocked using a clock signal that has a frequency that is different from a chip rate of the device.

17. The device of claim 1, wherein the filter includes delay elements that have continuous time delays.

18. The device of claim 1, wherein the filter includes weight elements that have adjustable weights.

19. A computer system, comprising:
a processor;
memory, wherein the memory is configured to store one or more program module mechanisms; and
a device, the device including:
a semiconductor die having a surface;
a plurality of proximity connectors proximate to the surface, wherein the semiconductor die is configured to communicate signals by capacitive coupling using one or more of the plurality of proximity connectors; and
a circuit coupled to at least one of the plurality of proximity connectors, wherein the circuit is configured to communicate signals using voltage-mode signaling, wherein the circuit includes a filter to equalize the signals, and wherein the filter includes a capacitive-summing junction;
at least one delay element in the filter;
wherein the plurality of proximity connectors includes a first set of the proximity connectors that communicates current data and a second set of the proximity connectors that communicates data that was delayed by the delay element, wherein the first and second sets include different ones of the proximity connectors.

20. A device, comprising:
a semiconductor die having a surface;
a plurality of proximity connectors proximate to the surface;
a transmit circuit; and
a filter circuit coupled between the transmit circuit and the proximity connectors, wherein the filter circuit comprises:
a delay element;
a first selection circuit and a second selection circuit, wherein the first selection circuit includes a separate output coupled to each proximity connector in a first subset of the proximity connectors, wherein the second selection circuit includes a separate output coupled to each proximity connector in a second subset of the proximity connectors, wherein the first subset of the proximity connectors and the second subset of the proximity connectors are different subsets of the proximity connectors;
a first signal path coupled directly between an output of the transmit circuit and an input of the first selection circuit; and
a second signal path coupled from the output of the transmit circuit to an input of the delay element and from an output of the delay element to an input of the second selection circuit;
wherein the first selection circuit outputs a signal received on the first signal path to selected outputs coupled to the first subset of the proximity connectors based on a state of a select input of the first selection circuit; and
wherein the second selection circuit outputs a signal received on the second signal path to selected outputs coupled to the second subset of the proximity connectors based on a state of a select input of the second selection circuit.

21. The device of claim 20, further comprising:
a control logic circuit, wherein a first output signal from the control logic circuit is coupled to the select input of the first selection circuit and a second output signal from the control logic circuit is coupled to the select input of the second selection circuit;
wherein the control logic circuit sets the first output signal to configure the proximity connectors in the first subset of the proximity connectors to which the first selection circuit outputs signals; and
wherein the control logic circuit sets the second output signal to configure the proximity connectors in the second subset of the proximity connectors to which the second selection circuit outputs signals.

22. The device of claim 20, wherein the proximity connectors are physically arranged in a group, and wherein the first subset of the proximity connectors is located on a border of the group and the second subset of the proximity connectors is located in an interior of the group.

* * * * *